United States Patent
Sporea et al.

(10) Patent No.: US 7,616,501 B2
(45) Date of Patent: Nov. 10, 2009

(54) METHOD FOR REDUCING CHARGE LOSS IN ANALOG FLOATING GATE CELL

(75) Inventors: Radu A. Sporea, Surrey (GB); Sorin S. Georgescu, San Jose, CA (US); Ilie Marian I. Poenaru, Bucharest (RO)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 20 days.

(21) Appl. No.: 11/943,578

(22) Filed: Nov. 20, 2007

(65) Prior Publication Data

US 2008/0130362 A1    Jun. 5, 2008

Related U.S. Application Data

(60) Provisional application No. 60/868,456, filed on Dec. 4, 2006.

(51) Int. Cl.
*G11C 16/04*    (2006.01)
(52) U.S. Cl. .................. 365/185.24; 365/185.02; 365/185.14; 365/185.01; 365/185.28
(58) Field of Classification Search .......... 365/185.02, 365/185.01, 185.14, 185.24, 185.28
See application file for complete search history.

(56) References Cited

U.S. PATENT DOCUMENTS

| 6,137,720 | A  |   | 10/2000 | Lancaster |
| 6,898,123 | B2 |   | 5/2005  | Owen |
| 7,280,063 | B2 | * | 10/2007 | Ozalevli et al. ............. 341/144 |
| 2002/0109539 | A1 |  | 8/2002 | Takeuchi et al. |
| 2005/0219916 | A1 | * | 10/2005 | Georgescu et al. ...... 365/189.01 |
| 2006/0067120 | A1 |  | 3/2006 | Drebinger |

\* cited by examiner

*Primary Examiner*—Thong Q Le
(74) *Attorney, Agent, or Firm*—Bever, Hoffman & Harms, LLP; E. Eric Hoffman

(57) ABSTRACT

A voltage reference circuit provides a reference voltage in response to a programmed threshold voltage of a first non-volatile memory (NVM) transistor. The threshold voltage of the first NVM transistor is programmed by applying a programming voltage to commonly connected source/drain regions of a tunneling capacitor, which shares a floating gate with the first NVM transistor. During normal operation of the voltage reference circuit, the source/drain regions of the tunneling capacitor are connected to a second NVM transistor that has the same electrical and thermal characteristics as the floating gate of the first NVM transistor. As a result, charge loss from the floating gate of the first NVM transistor is advantageously minimized.

19 Claims, 6 Drawing Sheets

US 7,616,501 B2

METHOD FOR REDUCING CHARGE LOSS IN ANALOG FLOATING GATE CELL

RELATED APPLICATION

The present application is related to, and claims priority of, U.S. Provisional Patent Application Ser. No. 60/868,456 filed by Radu A. Sporea, Sorin S. Georgescu and Ilie M. Poenaru on Dec. 4, 2006.

BACKGROUND OF THE INVENTION

1. Technical Field

The present invention is in the field of non-volatile programmable integrated circuits using standard CMOS technology.

2. Related Art

Floating gate reference circuits generate a reference voltage in response to the charge stored on the floating gate of a nonvolatile memory transistor. The nonvolatile memory transistor is typically programmed through the thin oxide of a programming capacitor. However, charge can leak through this thin oxide when bias voltage is applied over long periods of time, especially at high temperatures, thereby undesirably affecting the generated reference voltage. It would therefore be desirable to have a circuit for accurately programming a nonvolatile memory transistor in a floating gate reference circuit, and then maintaining the programmed charge over a long period of time.

SUMMARY

Accordingly, the present invention provides a voltage reference circuit that provides a single-ended reference voltage in response to a programmed threshold voltage of a first non-volatile memory (NVM) transistor. The threshold voltage of the first NVM transistor is initially programmed through a tunneling capacitor, which shares a floating gate with the first NVM transistor. A programming terminal of the tunneling capacitor (i.e., commonly connected source/drain regions) is separated from this floating gate by a thin oxide layer. The threshold voltage of the first NVM transistor is programmed by applying a programming voltage the programming terminal of the tunneling capacitor, thereby inducing Fowler-Nordheim tunneling across the thin oxide layer.

During normal operation of the voltage reference circuit, the first NVM transistor is connected in a current mirror configuration with a second NVM transistor. A differential amplifier having inputs coupled to the drains of the first NVM transistor and the second NVM transistor provides the reference voltage as an output. Also during normal operation, the programming terminal of the tunneling capacitor is connected to a semiconductor structure (e.g., a third NVM transistor) that is configured to have the same electrical and thermal characteristics as the floating gate of the first NVM transistor. As a result, during normal operation, the voltage of the programming terminal remains substantially equal to the voltage of the floating gate of the first NVM transistor over a wide range of operating conditions, thereby minimizing charge loss through the tunneling capacitor.

The present invention will be more fully understood in view of the following description and drawings.

DETAILED DESCRIPTION

Figure 1:
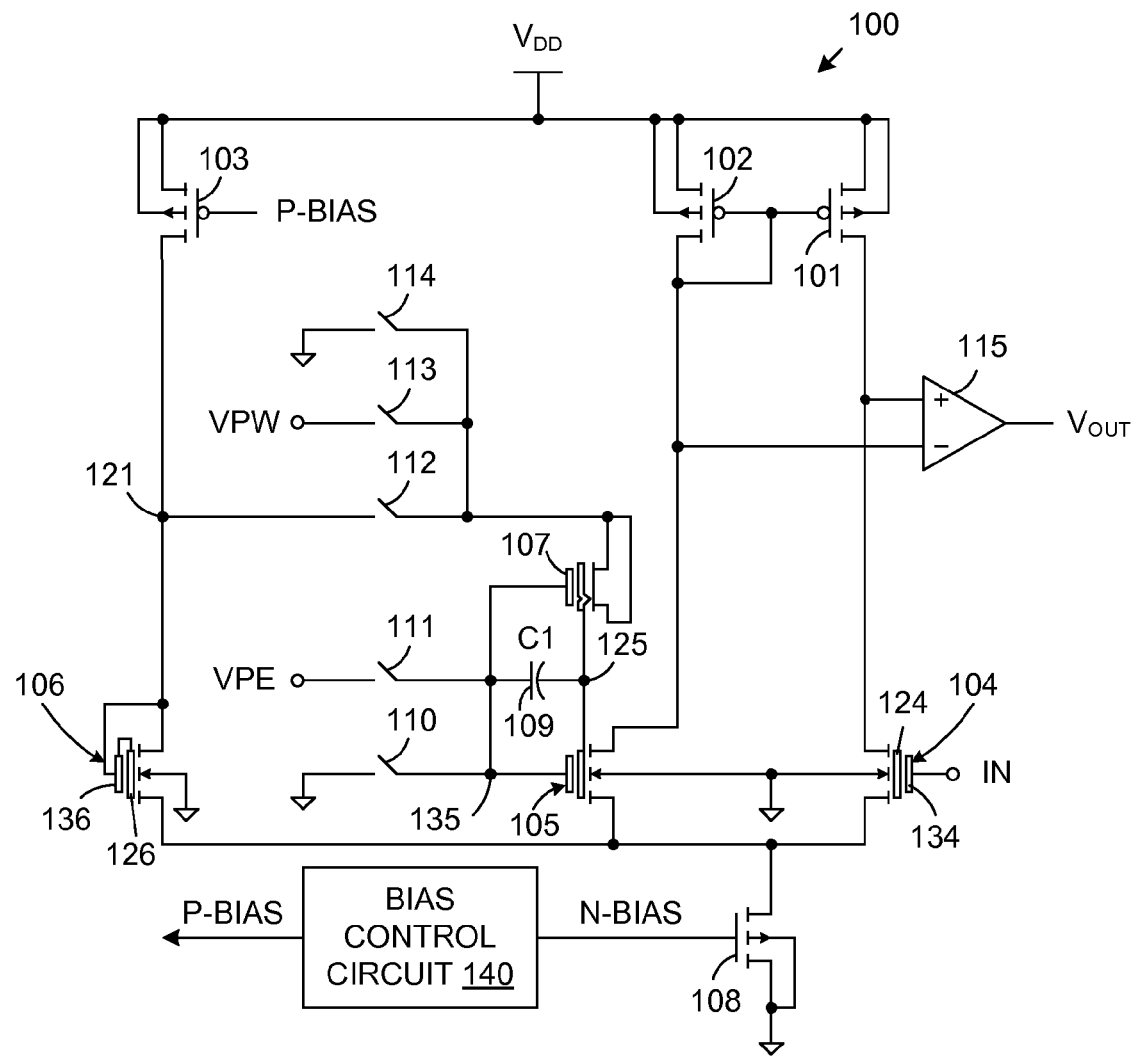
FIG. 1 is a circuit diagram of a portion of a CMOS floating gate voltage reference circuit, in accordance with one embodiment of the present invention.

FIG. 1 is a circuit diagram of a portion of a CMOS floating gate voltage reference circuit 100, in accordance with one embodiment of the present invention. Circuit 100 includes p-channel MOS transistors 101-103, n-channel non-volatile memory (NVM) transistors 104-106, thin-dielectric tunnel capacitor 107, n-channel MOS transistor 108, capacitor 109, switches 110-114, differential amplifier 115, and bias control circuit 140.

In general, the CMOS floating gate voltage reference circuit 100 generates a reference output voltage $V_{OUT}$ at the output of comparator 115, which has input terminals coupled to the drains of NVM transistors 104 and 105. Capacitor 109 (i.e., the floating gate 125 of NVM transistor 105) is initially programmed with a desired charge, while controlling the voltage applied to the control gate and floating gate of NVM transistor 104. After programming is complete, the output of comparator 115 is fed back to the control gate and floating gate of NVM transistor 104 to produce the output reference voltage $V_{OUT}$. In one embodiment, the CMOS voltage reference circuit 100 utilizes two NVM transistors, wherein the floating gate of one of these NVM transistors is discharged (for example, by UV irradiation) while the floating gate of the other NVM transistor is programmed with a desired charge. In another embodiment, the full CMOS voltage reference circuit may be implemented as described in commonly-owned U.S. patent application Ser. No. 11/355,394 or commonly-owned U.S. patent application Ser. No. 11/611,665.

Non-volatile memory transistors 104, 105 and 106 include floating gates 124, 125 and 126, respectively, and control gates 134, 135 and 136, respectively. NVM transistors 104-106 have the same geometry and transversal structure. The body regions of NVM transistors 104-106 are connected to ground. Each of non-volatile memory transistors 104-106 has a standard double polysilicon gate structure with a dielectric thickness large enough (e.g., greater than 100 Angstroms) to prevent charge leakage from the floating gates 124-126. In one embodiment, each of the floating gates 124-126 is separated from the corresponding control gate 134-136 by a dielectric with effective silicon dioxide thickness of about 150-250 Angstroms. This dielectric can be, for example, a sandwich of silicon oxide/silicon nitride/silicon oxide (ONO). The control gates 134 and 135 of memory transistors 104 and 105 are capacitively coupled to their respective floating gates 124 and 125 through this dielectric. The control gate 136 and the floating gate 126 of NVM transistor 106 are electrically shorted to the drain of NVM transistor 106 for reasons that will become apparent in view of the following disclosure.

Capacitor 109, which has a capacitance C1, is coupled between floating gate 125 and control gate 135 of non-volatile memory transistor 105. Capacitor 109 increases the capacitive coupling to the floating gate 125, and also helps to lower the required programming voltage.

Tunnel capacitor 107 is formed by a floating gate transistor having commonly-coupled source and drain regions, a control gate that is common with the control gate 135 of NVM transistor 105, and a floating gate that is common with the floating gate 125 of NVM transistor 105.

In the described embodiment, tunnel capacitor 107 has a thin dielectric (about 60-120 Angstroms of effective silicon dioxide) that can conduct current under a high voltage bias, in the range of about 6 to 12 Volts. As described in more detail below, tunneling current is passed through the thin dielectric of tunnel capacitor 107 to floating gate 125, thus changing the threshold voltage of non-volatile memory transistor 105 to desired levels. More specifically, tunnel capacitor 107 allows the electrical charging of floating gate 125 through Fowler-Nordheim conduction, by applying a large voltage (of either polarity) across the thin dielectric of tunnel capacitor 107. This physical process is well known to those knowledgeable in the field of EEPROM memory devices.

The sources of non-volatile memory transistors 104-106 are commonly connected to the drain of n-channel transistor 108. The source of n-channel transistor 108 is coupled to ground, and the gate of n-channel transistor 108 is coupled to receive a bias signal, N-BIAS, from bias control circuit 140. The drains of non-volatile memory transistors 104, 105 and 106 are coupled to the drains of p-channel transistors 101, 102 and 103, respectively. The sources and body regions of p-channel transistors 101-103 are commonly connected to the $V_{DD}$ voltage supply terminal. The gates of p-channel transistors 101 and 102 are commonly connected to the drain of p-channel transistor 102. P-channel transistors 101 and 102 are therefore arranged in a current mirror configuration. In the described embodiment, p-channel transistors 101 and 102 are identical transistors. As a result, p-channel transistors 101-102 and non-volatile memory transistors 104-105 form two matched circuit branches.

The gate of p-channel transistor 103 is coupled to receive a bias signal, P-BIAS, from the bias control circuit 140. The drain of p-channel transistor 103 and the drain of NVM transistor 106 are coupled to switch 112 at terminal 121. Switches 110 and 111 are configured to selectively couple the control gate 135 of non-volatile memory transistor 105 to a ground terminal, or an erase voltage terminal VPE, respectively. Switches 112, 113 and 114 are configured to selectively couple the source/drain regions of tunnel capacitor 107 to terminal 121, a programming voltage terminal VPW, or a ground terminal, respectively.

The input terminals of differential amplifier 115 are coupled to the drains of p-channel transistors 101 and 102. The output terminal of differential amplifier 115 is coupled to programming logic (not shown) and reference voltage output terminal, which supplies the output reference voltage $V_{OUT}$.

Figure 2:
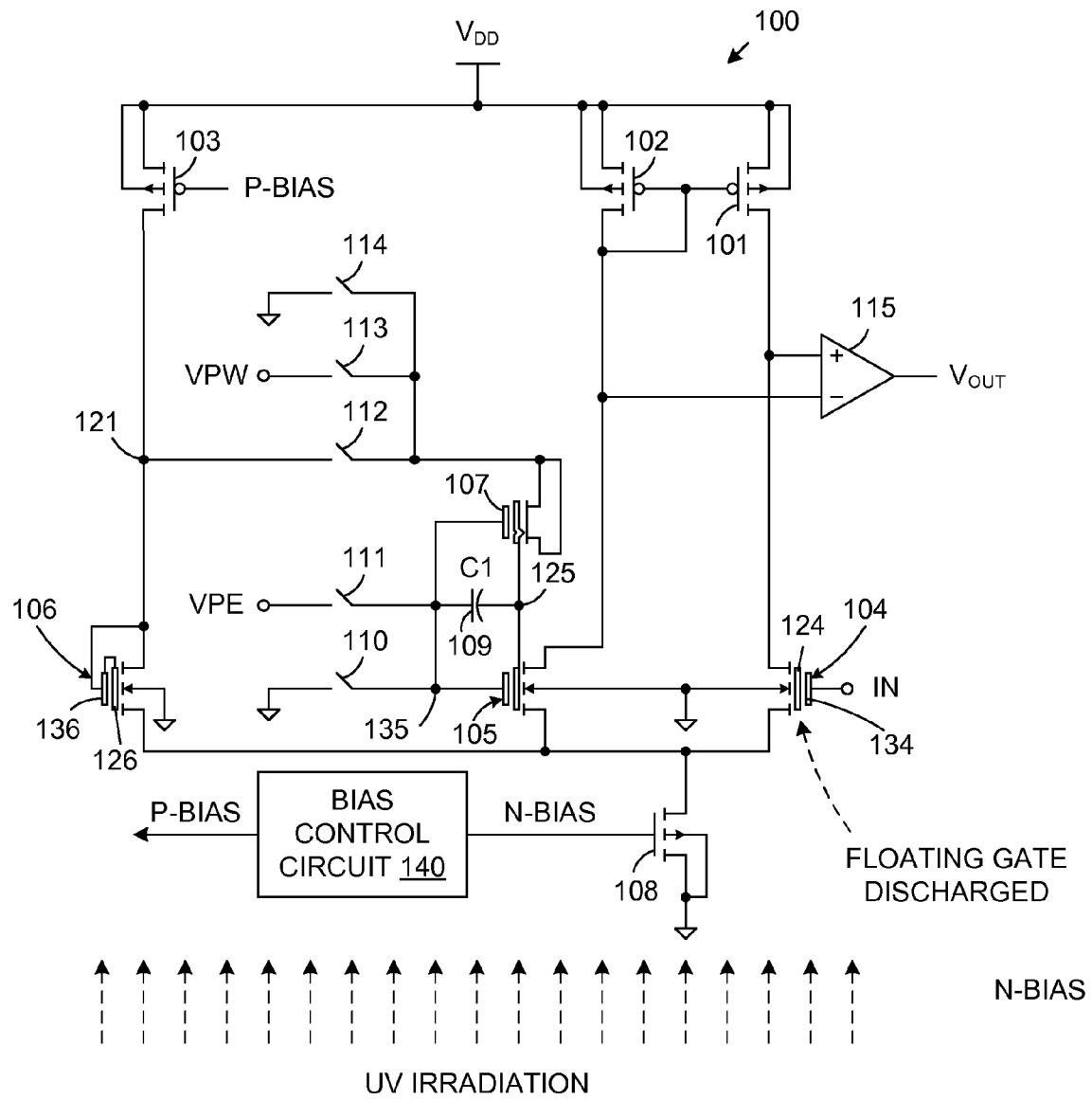
FIG. 2 is a circuit diagram of the portion of the CMOS floating gate voltage reference circuit of FIG. 1, configured to set a threshold voltage of an NVM transistor in accordance with one embodiment of the present invention.

In general, circuit 100 operates as follows. Non-volatile memory transistor 104 is initially controlled to have a charge close to zero. FIG. 2 is a circuit diagram illustrating the setting the floating gate charge of NVM transistor 104 in accordance with one embodiment of the present invention. In this embodiment, floating gate 124 of non-volatile memory transistor 104 is initially discharged to a neutral state by ultraviolet (UV) irradiation (e.g., using a UV erase procedure of a standard EEPROM memory process). Note that the floating gates 125-126 of transistors 105-106 are typically discharged at the same time as floating gate 124. However, after the initial discharge is complete, the threshold voltage of non-volatile memory transistor 104 remains substantially the same throughout the operation of circuit 100. That is, there is no intentional charge transfer in or out of floating gate 124 after the threshold voltage has been set in non-volatile memory transistor 104.

Figure 3:
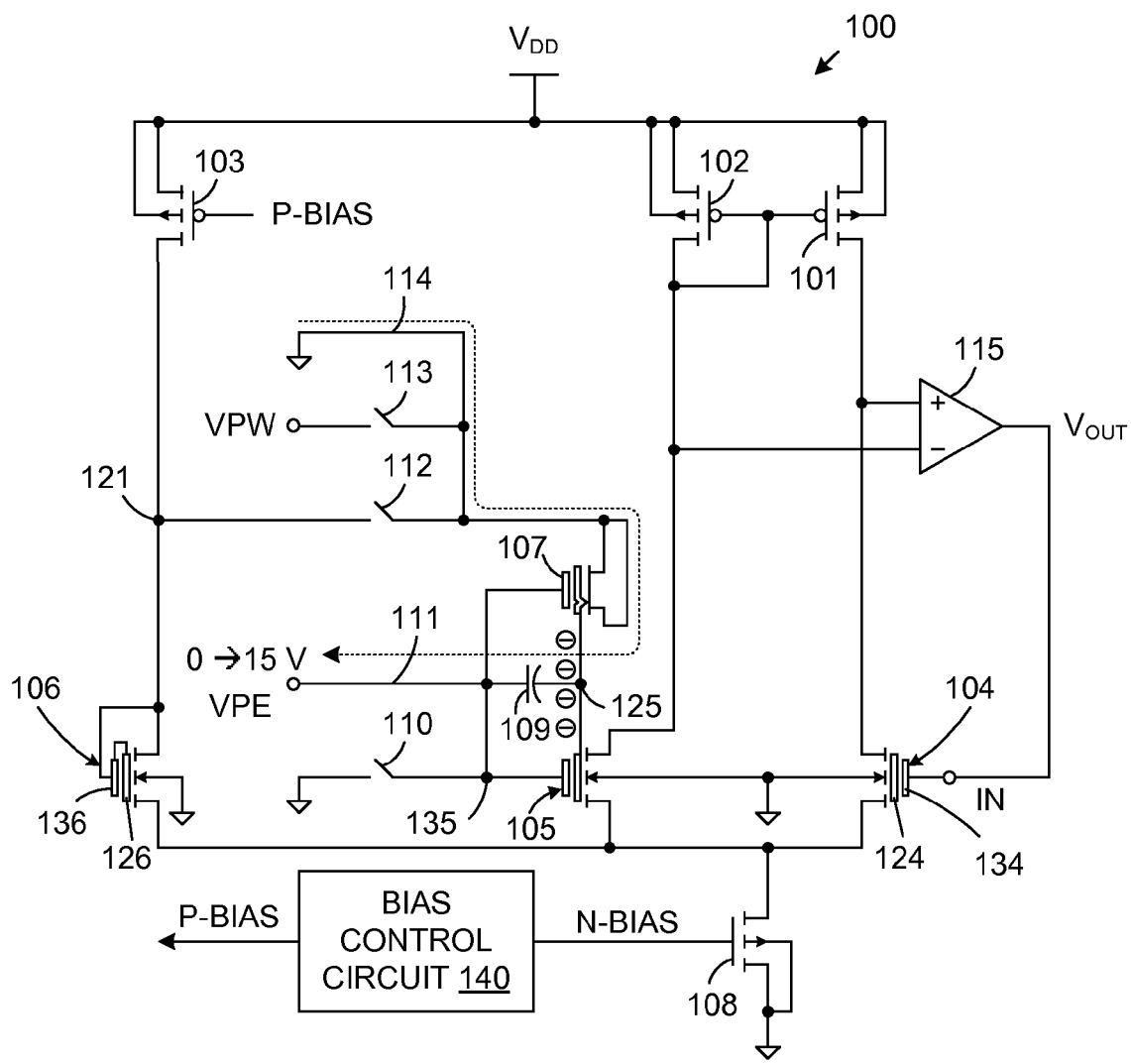
FIG. 3 is a circuit diagram of the portion of the CMOS floating gate voltage reference circuit of FIG. 1, configured to perform an erase operation on an NVM transistor in accordance with one embodiment of the present invention.

After the threshold voltage has been set within memory transistor 104, an erase operation is performed on non-volatile memory transistor 105. FIG. 3 is a circuit diagram illustrating an erase operation performed on NVM transistor 105 in accordance with one embodiment of the present invention. Prior to performing the erase operation, the current through n-channel transistor 108 is set to a desired level by the N-BIAS signal. The erase operation sets an initial large negative charge (which corresponds to a high threshold voltage) on floating gate 125 of non-volatile memory transistor 105. To perform the erase step, the output of comparator 115 is coupled to the control gate 134 of NVM transistor 104. Switch 114 is closed and switches 112-113 are opened, thereby applying a voltage of 0 Volts to the source/drain regions of tunnel capacitor 107. Switch 111 is closed and switch 110 is opened, such that an erase signal applied to the erase terminal VPE is coupled to the control gate 135 of NVM transistor 105 and tunnel capacitor 107. The erase signal varies from a low voltage of 0 Volts to a high voltage of 15 Volts. During this operation, the voltage applied across the thin dielectric of tunnel capacitor 107 results in a Fowler-Nordheim tunneling current that charges floating gate 125 with negative charge.

As a result, the threshold voltage of non-volatile memory transistor 105 is increased to a relatively large value, typically in the range of 2 to 8 Volts. The final potential of floating gate 125 and the corresponding threshold voltage of non-volatile memory transistor 105 is dependent on the highest value of the applied erase signal. The precise threshold voltage of non-volatile memory transistor 105 is not critical in this step, as this threshold voltage only sets an acceptable initial state before this non-volatile memory transistor 105 is subsequently programmed.

Non-volatile memory transistor 105 is then programmed. More specifically, the floating gate 125 of non-volatile memory transistor 105 is programmed with a precise positive charge, in a closed loop cycle, using the voltage applied on the control gate 134 of memory transistor 104 (i.e., the IN pin) as a reference voltage.

Figure 4:
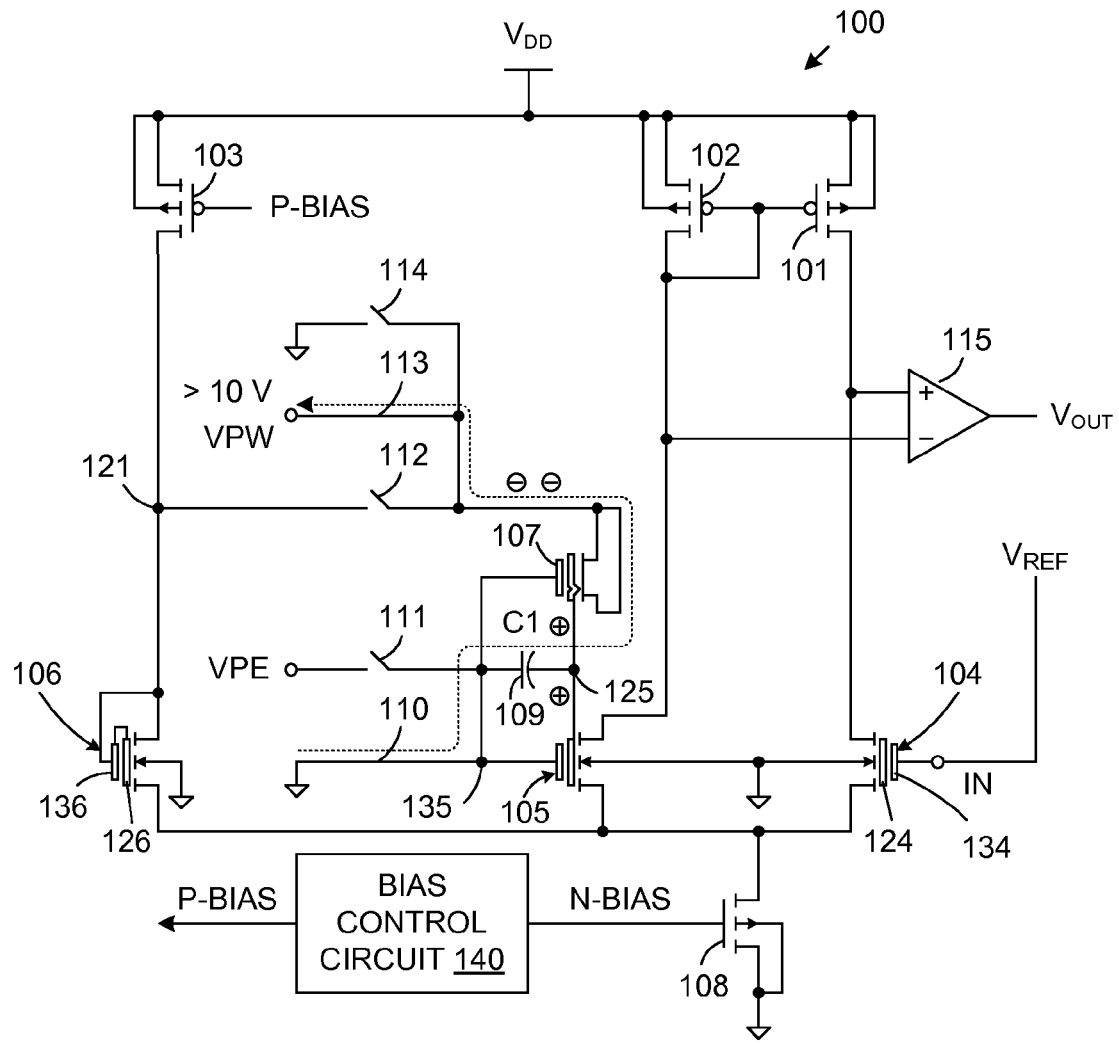
FIG. 4 is a circuit diagram of the portion of the CMOS floating gate voltage reference circuit of FIG. 1, configured to program an NVM transistor in accordance with one embodiment of the present invention.

FIG. 4 is a circuit diagram illustrating the programming of NVM transistor 105 in accordance with one embodiment of the present invention. During this program operation, the output of comparator 115 is decoupled from NVM transistor 104, and a reference voltage $V_{REF}$ is applied to the control gate 134 (i.e., the IN pin) of NVM transistor 104.

Switch 113 is closed and switches 112 and 114 are opened, thereby coupling the programming terminal VPW to the source/drain regions of tunnel capacitor 107. Switch 110 is closed and switch 111 is opened, thereby coupling the control gate 135 of NVM transistor 105 and tunnel capacitor 107 to ground. A programming signal is applied to the programming terminal VPW, wherein the programming signal is ramped up to a positive value greater than 10 Volts. Because control gate 135 is grounded, the voltage applied across the thin dielectric of tunnel capacitor 107 results in Fowler-Nordheim tunneling current that removes negative charge from floating gate 125. As a result, the threshold voltage of non-volatile memory transistor 105 is reduced. Note that the high voltage applied across tunnel capacitor 107 has different polarities during the erase operation and the program operation.

As more negative charge is removed from floating gate 125, the threshold voltage of transistor 105 continues to be reduced, thereby resulting in increased current flow through non-volatile memory transistor 105. The programming of non-volatile memory transistor 105 continues until the drain current through NVM transistor 105 is equal to the drain current through memory transistor 104. When the drain current of NVM transistor 105 becomes greater than the drain current through memory transistor 104, the output of differential amplifier 115 changes state, thereby signaling the program logic (not shown) to stop the programming operation (by turning off the programming signal applied to the programming terminal VPW). At this time, the threshold voltage of non-volatile memory transistor 105 is programmed to a value which precisely represents the reference voltage $V_{REF}$ applied to the control gate 134 of NVM transistor 104 during programming.

The normal operating mode is then enabled, wherein NVM transistors 104 and 105 are coupled to differential amplifier 115, thereby causing differential amplifier 115 to output a reference voltage $V_{OUT}$ which corresponds with the programmed threshold voltage of NVM transistor 105. In this manner, a stable and precise reference voltage is provided on a low impedance node.

Figure 5:
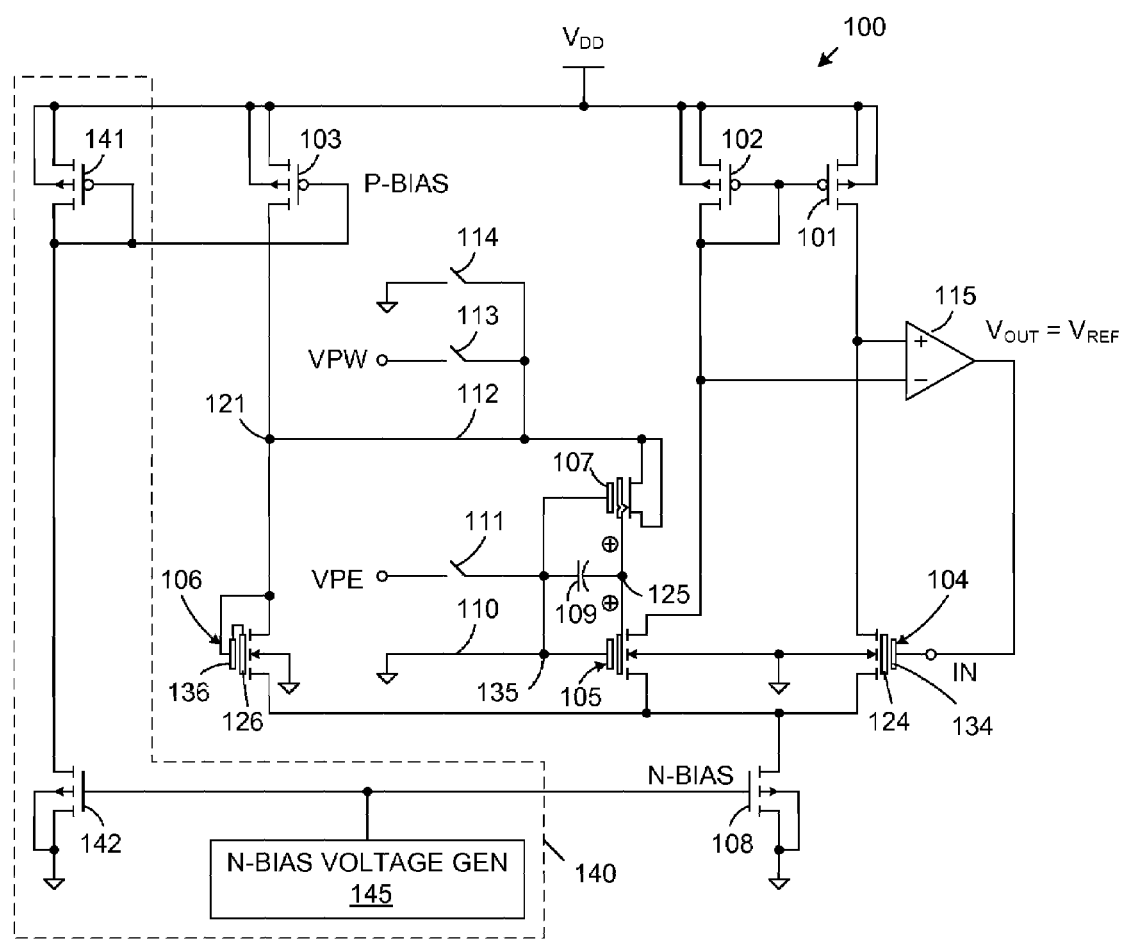
FIG. 5 is a circuit diagram of the portion of the CMOS floating gate voltage reference circuit of FIG. 1, configured in a normal operating mode in accordance with one embodiment of the present invention.

FIG. 5 is a circuit diagram illustrating the normal operating mode in accordance with one embodiment of the present invention. Bias control circuit 140 is shown in more detail in FIG. 5. In the illustrated embodiment, bias control circuit 140 includes p-channel transistor 141, n-channel transistor 142 and N-BIAS voltage generator 145.

To enable the normal operating mode, the output terminal of comparator 115 is coupled to the control gate 134 of NVM transistor 104 (and NVM transistor 104 is decoupled from the external reference voltage, $V_{REF}$). Switch 110 is closed and switch 111 is opened, such that the control gate 135 of NVM transistor 105 and tunnel capacitor 107 is coupled to ground. In addition, switch 112 is closed and switches 113 and 114 are opened, such that the source/drain regions of tunnel capacitor 107 are connected to terminal 121.

Under these conditions, p-channel transistors 101-102 force identical currents to flow through the drains of NVM transistors 104 and 105, respectively. Any imbalance between the drain currents of NVM transistors 104 and 105 is amplified by differential amplifier 115. The output of differential amplifier 115 is fed back to the control gate 134 of NVM transistor 104, thereby ensuring that the currents through NVM transistors 104 and 105 are equal and that the two floating gates 124 and 125 are maintained at the same voltage. As a result, the output reference voltage $V_{OUT}$ corresponds with the programmed voltage of floating gate 125.

By closing switch 112, the source/drain regions of tunnel capacitor 107 are commonly connected to the drain of PMOS transistor 103, the drain of NVM transistor 106, the control gate 136 of NVM transistor 106 and the floating gate 126 of NVM transistor 106. The connection provided by switch 112 is important for the following reasons.

The thin dielectric of tunnel capacitor 107 is a source of undesirable charge leakage from capacitor 109 when the voltage across this thin dielectric has a value other than 0 Volts. The charge loss through the thin dielectric of tunnel capacitor 107 increases with temperature.

To eliminate charge leakage through the thin dielectric of tunnel capacitor 107, switch 112 connects the programming terminal (i.e., the source/drain regions) of tunnel capacitor 107 to an electrical potential identical to and exhibiting the same temperature dependence as the floating gate 125. As a result, the same temperature-based voltage changes occur on both the floating gate 125 and the source/drain regions of tunneling capacitor 107. Consequently, a zero voltage differential is maintained across the floating gate 125 and the source/drain regions of tunneling capacitor 107 over varying temperatures, thereby minimizing charge leakage.

Terminal 121 is provided with the same electrical potential and the same temperature dependence as floating gate 125 in the following manner. Within bias control circuit 140, p-channel transistor 141 is identical to p-channel transistors 101-103, and n-channel transistor 142 is three times smaller than n-channel transistor 108. As a result, the current flowing through n-channel transistor 142 (and therefore the current flowing through p-channel transistor 141) is equal to one-third of the current flowing through n-channel transistor 108. Because p-channel transistors 141 and 103 are configured in a current mirror arrangement, the current flowing through p-channel transistor 103 is equal to the current through p-channel transistor 141, or one-third of the current through n-channel transistor 108. The current through NVM transistor 106 is therefore also equal to one-third of the current through n-channel transistor 108.

The remaining two-thirds of the current through n-channel transistor 108 flows through p-channel transistors 101 and 102. As described above, the configuration of these p-channel transistors 101-102 results in substantially equal currents through these transistors. Thus, the current flowing through each of p-channel transistors 101 and 102 is approximately equal to one-third of the current through n-channel transistor 108. Thus, substantially equal currents flow through p-channel transistors 101, 102 and 103. Consequently, substantially equal currents also flow through the associated NVM transistors 104, 105 and 106.

As described above, NVM transistor 106 has a geometry and transversal structure identical to NVM transistors 104 and 105. However, the drain, the control gate 136 and the floating gate 126 of NVM transistor 106 are electrically shorted. Because the floating gate 126 of NVM transistor 106 is identical to the floating gate 125 of NVM transistor 105, the electrical and thermal characteristics of these floating gates are substantially the same. Thus, by coupling the source/drain regions of tunnel capacitor 107 to the floating gate 126 of NVM transistor 106, the electrical and thermal characteristics of the source/drain regions of tunnel capacitor 107 are substantially identical to the electrical and thermal characteristics of floating gate 125. Maintaining equal currents through these NVM transistors 105 and 106 will cause these NVM transistors to have substantially identical operating conditions.

Under these conditions, a zero voltage drop is maintained between the floating gate 125 and the source/drain regions of tunnel capacitor 107, essentially eliminating the loss of charge from capacitor 109 through the thin dielectric of tunneling capacitor 107.

The present invention advantageously increases the precision of the programmed reference voltage, increases the stability of the programmed reference voltage over time, reduces the current consumption required to implement a reference voltage circuit, and preserves a small overall circuit area.

Figure 6:
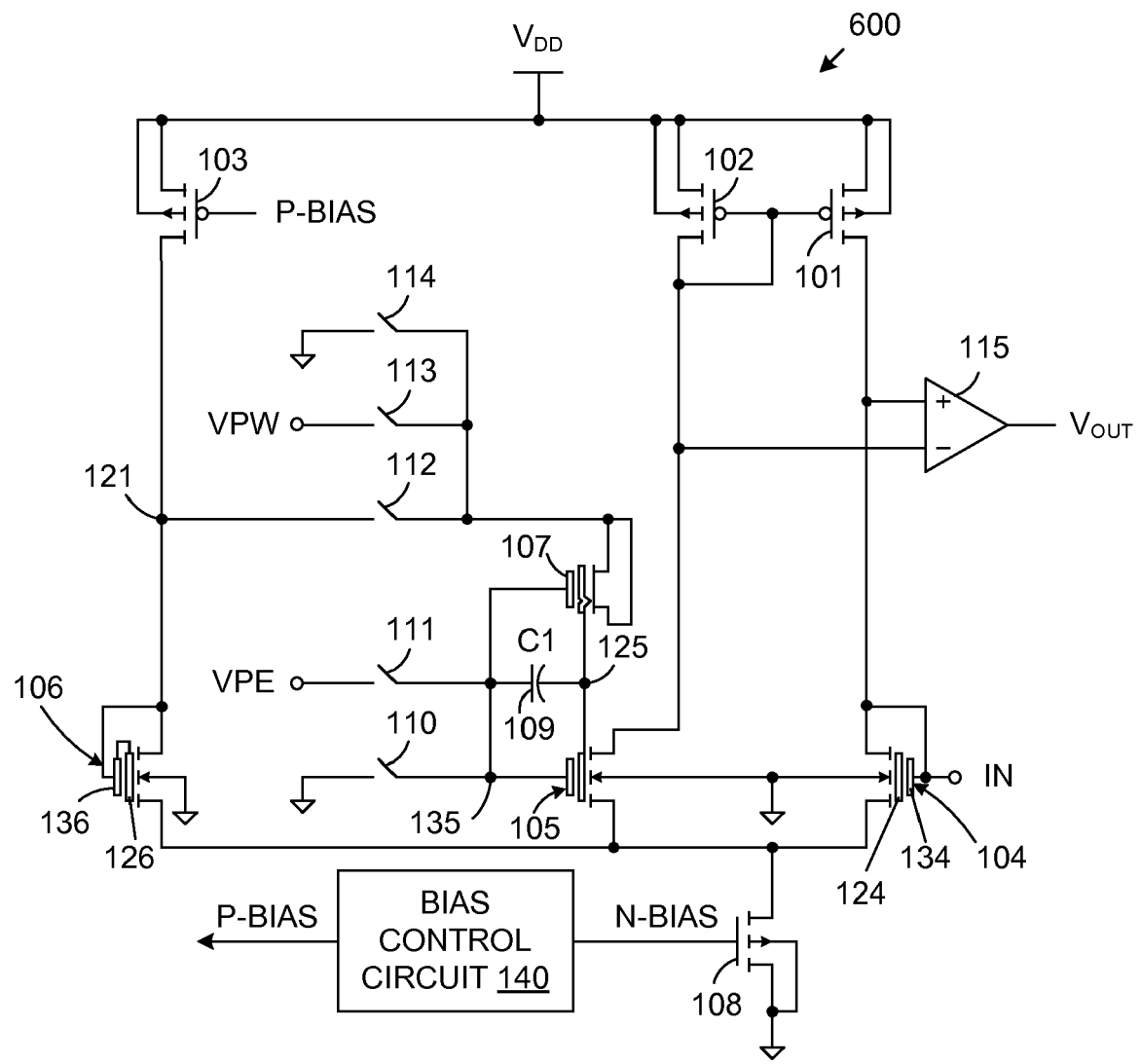
FIG. 6 is a circuit diagram of a portion of a CMOS floating gate voltage reference circuit, in accordance with an alternate embodiment of the present invention.

FIG. 6 is a circuit diagram of a portion of a CMOS floating gate voltage reference circuit 600 in accordance with an alternate embodiment of the present invention. Because CMOS floating gate voltage reference circuit 600 is similar to CMOS floating gate voltage reference circuit 100 (FIG. 1), similar elements in FIGS. 1 and 6 are labeled with similar reference numbers. In the embodiment of FIG. 6, the floating gate 124 and the control gate 134 of non-volatile memory transistor 104 are electrically shorted, thereby effectively rendering transistor 104 a standard gate transistor, which exhibits a standard threshold voltage. In this embodiment, it is not necessary to initially discharge the floating gate 124 of transistor 104 to a neutral state by exposure to UV irradiation in the manner described above in connection with FIG. 2. However, the CMOS floating gate voltage reference circuit 600 may be controlled to implement erase, program and normal operating modes in the same manner described above in connection with FIGS. 3, 4 and 5, with similar results.

Although the present invention has been described in connection with specific embodiments, it is understood that variations to these embodiments could be made by those of ordinary skill in the art. Thus, the present invention is limited only by the following claims.

We claim:

1. A method of providing a reference voltage in an integrated circuit, comprising:
    programming a threshold voltage of a first non-volatile memory (NVM) transistor via a tunneling capacitor, wherein the first NVM transistor and the tunneling capacitor share a first floating gate and the tunneling capacitor has a programming terminal separate from the first floating gate; then
    coupling the programming terminal of the tunneling capacitor to a semiconductor structure having electrical and thermal characteristics selected to match electrical and thermal characteristics of the first floating gate; and
    generating a single-ended reference voltage in response to the programmed threshold voltage of the first NVM transistor while the programming terminal of the tunneling capacitor is coupled to the semiconductor structure.

2. The method of claim 1, wherein the step of programming the threshold voltage of the first NVM transistor comprises applying a programming voltage across the programming terminal of the tunneling capacitor and the first floating gate.

3. The method of claim 1, further comprising:
    coupling a second NVM transistor in a current mirror configuration with the first NVM transistor during the step of programming the threshold voltage of the first NVM transistor; and
    applying a reference voltage to the second NVM transistor during the step of programming the threshold voltage of the first NVM transistor.

4. The method of claim 3, further comprising:
    coupling the first NVM transistor and the second NVM transistor to a differential amplifier during the step of programming the threshold voltage of the first NVM transistor; and
    terminating the step of programming the threshold voltage of the first NVM transistor when an output of the differential amplifier switches.

5. The method of claim 3, further comprising initializing a threshold voltage of the second NVM transistor to a neutral state prior to programming the threshold voltage of the first NVM transistor.

6. The method of claim 5, wherein the step of initializing the threshold voltage of the second NVM transistor comprises exposing the second NVM transistor to ultra-violet (UV) radiation.

7. The method of claim 1, further comprising coupling a second NVM transistor in a current mirror configuration with the first NVM transistor during the step of generating the single-ended reference voltage.

8. The method of claim 7, further comprising coupling the first NVM transistor and the second NVM transistor to inputs of a differential amplifier during the step of generating the single-ended reference voltage, wherein the differential amplifier provides the single-ended reference voltage.

9. The method of claim 7, wherein a first current flows through the first NVM transistor during the step of generating the single-ended reference voltage, the method further comprising causing a current equal to the first current to flow through the semiconductor structure during the step of generating the single-ended reference voltage.

10. The method of claim 1, further comprising erasing the first NVM transistor via the tunneling capacitor prior to programming the threshold voltage of the first NVM transistor.

11. The method of claim 1, wherein the threshold voltage of the first NVM transistor is programmed by Fowler-Nordheim tunneling.

12. A voltage reference circuit for generating a reference voltage, comprising:
    a first non-volatile memory (NVM) transistor having a first floating gate configured to store a programmed charge, wherein the reference voltage is generated in response to the programmed charge stored on the first floating gate;
    a tunneling capacitor that shares the first floating gate with the first NVM transistor, wherein the tunneling capacitor has a programming terminal separate from the first floating gate;
    a semiconductor structure having electrical and thermal characteristics selected to match electrical and thermal characteristics of the first NVM transistor;
    a first switch configured to couple the programming terminal to the semiconductor structure during a normal operating mode in which the voltage reference circuit generates the reference voltage.

13. The voltage reference circuit of claim 12, further comprising a second switch configured to couple the programming terminal to a programming voltage during a programming mode in which the programmed charge is stored on the first floating gate.

14. The voltage reference circuit of claim 12, wherein the programming terminal comprises commonly coupled source/drain regions of a non-volatile memory transistor structure.

15. The voltage reference circuit of claim 12, further comprising:
    a second NVM transistor coupled in a common source configuration with the first NVM transistor; and
    a differential amplifier having inputs coupled to the first and second NVM transistors, and an output configured to provide the reference voltage.

16. The voltage reference circuit of claim 15, wherein the first NVM transistor is identical to the second NVM transistor and the semiconductor structure is a third NVM transistor identical to the first and second NVM transistors.

17. The voltage reference circuit of claim 12, wherein the semiconductor structure comprises an NVM transistor structure comprising:
    a drain region, wherein the first switch is coupled between the drain region and the programming terminal;
    a control gate coupled to the drain region;
    a second floating gate coupled to the control gate.

18. The voltage reference circuit of claim 17, wherein the NVM transistor structure further comprises a source region commonly coupled to a source region of the first NVM transistor.

19. The voltage reference circuit of claim 12, further comprising a bias transistor configured to introduce a current through the semiconductor structure, which is equal to a current through the first NVM transistor.

* * * * *